(12) United States Patent
Kang

(10) Patent No.: US 10,051,749 B2
(45) Date of Patent: Aug. 14, 2018

(54) DISPLAY DEVICE

(71) Applicant: LG ELECTRONICS INC., Seoul (KR)

(72) Inventor: Seunggyu Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/629,391

(22) Filed: Jun. 21, 2017

(65) Prior Publication Data

US 2018/0027671 A1   Jan. 25, 2018

Related U.S. Application Data

(60) Provisional application No. 62/366,101, filed on Jul. 24, 2016.

(30) Foreign Application Priority Data

Jan. 4, 2017  (KR) ........................ 10-2017-0001206

(51) Int. Cl.
   *H05K 5/00* (2006.01)
   *H05K 7/20* (2006.01)
   (Continued)

(52) U.S. Cl.
   CPC ......... *H05K 5/0017* (2013.01); *H05K 5/0008* (2013.01); *H05K 5/0013* (2013.01);
   (Continued)

(58) Field of Classification Search
   CPC ......... G02F 1/133308; G02F 1/133314; G02F 1/133382; G02F 2001/133314;
   (Continued)

(56) References Cited

U.S. PATENT DOCUMENTS

2012/0314376 A1*  12/2012  Mukaide ........... G02F 1/133308
   361/724
2013/0100357 A1*  4/2013  Yokawa ............ G02F 1/133615
   348/725
(Continued)

FOREIGN PATENT DOCUMENTS

EP          3015907 A1     5/2016

*Primary Examiner* — Dion R Ferguson
*Assistant Examiner* — Amir Jalali
(74) *Attorney, Agent, or Firm* — Birch, Stewart, Kolasch & Birch, LLP

(57) ABSTRACT

A display device including a display panel; a module cover at a rear of the display panel; a rigid bar coupled with a coupling portion on a rear surface of the module cover, the rigid bar elongated along a side of the display panel; and a back cover at a rear of the module cover and covering the rigid bar. Further, the rigid bar includes a fastening plate spaced apart from the coupling portion of the module cover; a lateral plate bent toward the module cover from the fastening plate; and at least one first receiving portion formed on the lateral plate. In addition, the back cover includes an outer surface facing a rear of the back cover; an inner surface facing the module cover; and at least one first latch protruding from the inner surface and configured to be accommodated in the first receiving portion of the rigid bar.

20 Claims, 20 Drawing Sheets

(51) Int. Cl.
    *H05K 5/02*        (2006.01)
    *H05K 5/03*        (2006.01)

(52) U.S. Cl.
    CPC ......... *H05K 5/0213* (2013.01); *H05K 5/0217* (2013.01); *H05K 5/03* (2013.01); *H05K 7/20954* (2013.01)

(58) Field of Classification Search
    CPC ... G02F 1/1601; G09F 2013/222; H05K 5/02; H05K 5/0017; H05K 5/008; H05K 5/0013; H05K 5/0213; H05K 5/0217; H05K 5/03; H05K 7/20954
    USPC .............................. 361/707, 679.24; 349/58
    See application file for complete search history.

(56)                 References Cited

U.S. PATENT DOCUMENTS

| | | | |
|---|---|---|---|
| 2013/0114196 A1 | 5/2013 | Chen | |
| 2013/0221812 A1* | 8/2013 | Hashimoto | H05K 5/0004 312/7.2 |
| 2015/0301394 A1* | 10/2015 | Noguchi | G02F 1/133308 349/58 |
| 2015/0304599 A1* | 10/2015 | Yamamoto | H04N 5/645 348/836 |
| 2016/0014910 A1* | 1/2016 | Campagna | H05K 5/0017 361/679.01 |
| 2016/0135305 A1 | 5/2016 | Shin | |
| 2016/0282549 A1* | 9/2016 | Masuda | G02B 6/0085 |
| 2017/0164487 A1* | 6/2017 | Kim | H05K 7/142 |
| 2017/0251559 A1* | 8/2017 | Campagna | H05K 5/0017 |
| 2017/0295659 A1* | 10/2017 | Hori | H05K 5/0234 |

\* cited by examiner

DISPLAY DEVICE

This application claims the benefit of U.S. Provisional Patent Application No. 62/366,101 filed on Jul. 24, 2016, and Korean Patent Application No. 10-2017-0001206 filed on Jan. 4, 2017, the entire contents of which are incorporated herein by reference for all purposes as if fully set forth herein.

BACKGROUND OF THE INVENTION

Field of the Invention

The present disclosure relates to a display device.

Discussion of the Related Art

A display device includes a liquid crystal display (LCD), a field emission display (FED), a plasma display panel (PDP), and an electroluminescence device. As an example of an electroluminescence device, an active matrix type organic light emitting display device is commercially available. Since organic light emitting display devices are self-luminous devices, they have no backlight as compared with liquid crystal display devices, and have advantages in response speed, viewing angle, and the like, and are attracting attention as a next generation display.

The manufacturing process of the display device includes assembling the back cover to the module cover. The back cover can be fastened to the rear of the display panel and the module cover for displaying the input image.

When fastening the back cover to the module cover, there is a problem because the work process is long due to a large number of fastening parts including screws. Further, when fastening or removing the back cover to/from the module cover, the fastening parts are often broken, and the broken parts remain as foreign matters in the module cover.

SUMMARY OF THE INVENTION

Accordingly, one object of the present invention is to solve the above problems or other problems.

Another object of this invention is to provide a display device of which manufacturing process for assemble a back cover and a module cover is simplified.

Still another object of present invention is to provide a display device capable of preventing breakage of a fastening part when assembling or disassembling a back cover on a module cover.

Another object of present invention is to provide a display device including a rigid bar securing rigidity.

Yet another object of present invention is to provide a display device including a structure capable of fastening a rigid bar to the back cover.

Another object of present invention is to provide a display device capable of enhancing the heat dissipation.

The display device according to an embodiment of the present invention includes a display panel; a module cover at a rear of the display panel; a rigid bar coupled with a rear surface of the module cover, the rigid bar elongated along a side of the display panel, a first receiving portion formed on the rigid bar; and a back cover at a rear of the module cover, including: an outer surface facing a rear of the back cover; an inner surface facing the module cover; and a first latch protruding from the inner surface, wherein the first latch is accommodated in the first receiving portion of the rigid bar.

According to embodiments of the present invention, the process of assembling the back cover to the module cover is simplified by fastening the back cover to the module cover without using a screw by the rigid bar. Further, by fastening the back cover to the module cover without using a screw by the rigid bar, breakage of the fastening component can be prevented when assembling or separating the module cover and the back cover. In addition, the rigidity of the display device is greatly increased by further fastening the rigid bar, the auxiliary rigidity bar and the guide supporter to the module cover. Also, heat generated from the electronic component can be dissipated by the heat dissipation opening provided in the back cover.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
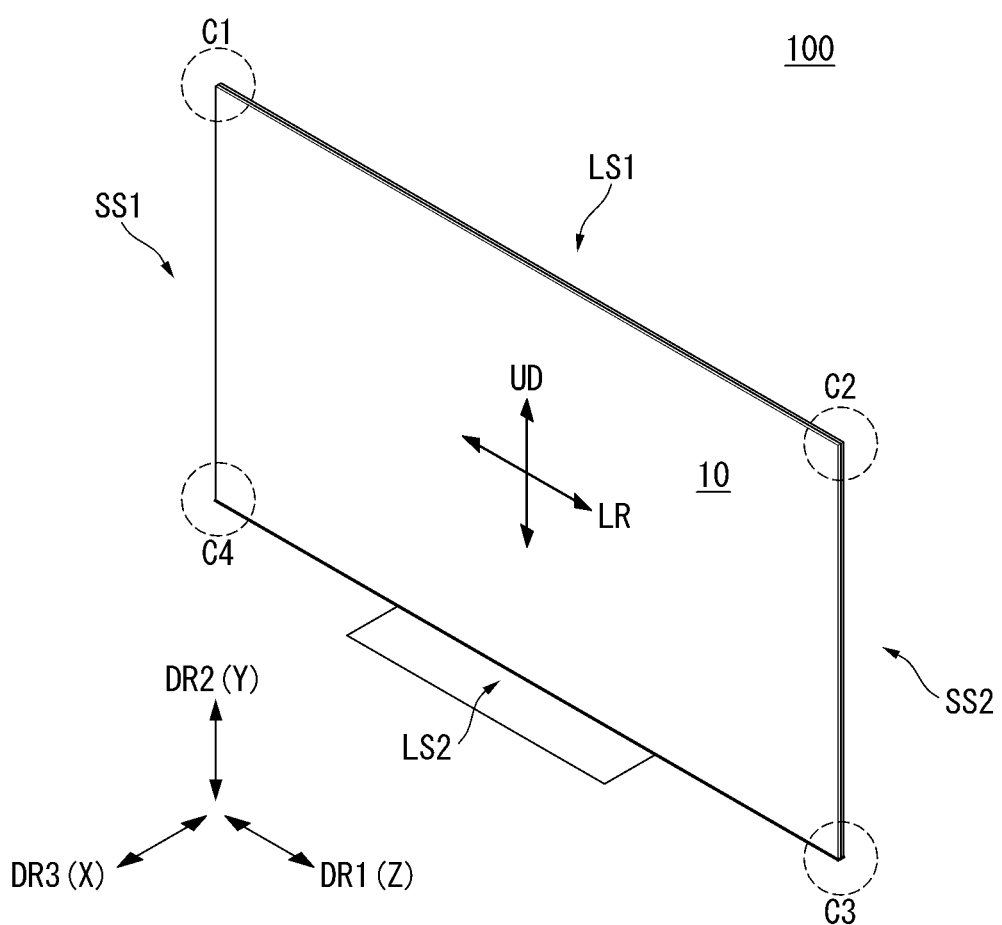
FIGS. 1 and 2 are views showing examples of a display device according to an embodiment of the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The teens 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed. When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context. In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, the embodiments of the invention are described using a liquid crystal display panel as an example of a display panel. Other display panels may be used. For example, a plasma display panel (PDP), a field emission display (FED) panel, and an organic light emitting diode (OLED) display panel may be used.

As shown in FIG. 1, a display device 100 includes a first long side LS1, a second long side LS2 opposite the first long side LS1, a first short side SS1 adjacent to the first long side LS1 and the second long side LS2, and a second short side SS2 opposite the first short side SS1.

Further, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

In addition, the lengths of the first and second long sides LS1 and LS2 are longer than lengths of the first and second short sides SS1 and SS2 for the sake of brevity and ease of reading. However, the lengths of the first and second long sides LS1 and LS2 can also be almost equal to the lengths of the first and second short sides SS1 and SS2.

In the following description, a first direction DR1 is a direction parallel to the long sides LS1 and LS2 of the display device 100, and a second direction DR2 is a direction parallel to the short sides SS1 and SS2 of the display device 100. Further, a third direction DR3 is a direction vertical to the first direction DR1 and/or the second direction DR2.

In addition, the first direction DR1 and the second direction DR2 may be commonly referred to as a horizontal direction. Further, the third direction DR3 may be referred to as a vertical direction. In another point of view, a side or a surface, on which the display device 100 displays an image, may be referred to as a front side or a front surface.

When the display device 100 displays the image, a side or a surface, at which the image cannot be observed, may be referred to as a back side or a back surface. When the display device 100 is observed at the front side or the front surface, the first long side LS1 may be referred to as an upper side or an upper surface. In the same manner as the first long side LS1, the second long side LS2 may be referred to as a lower side or a lower surface. Also, the first short side SS1 may be referred to as a left side or a left surface, and the second short side SS2 may be referred to as a right side or a right surface.

Further, the first long side LS1, the second long side LS2, the first short side SS1, and the second short side SS2 may be referred to as edges of the display device 100. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In addition, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

Figure 2:
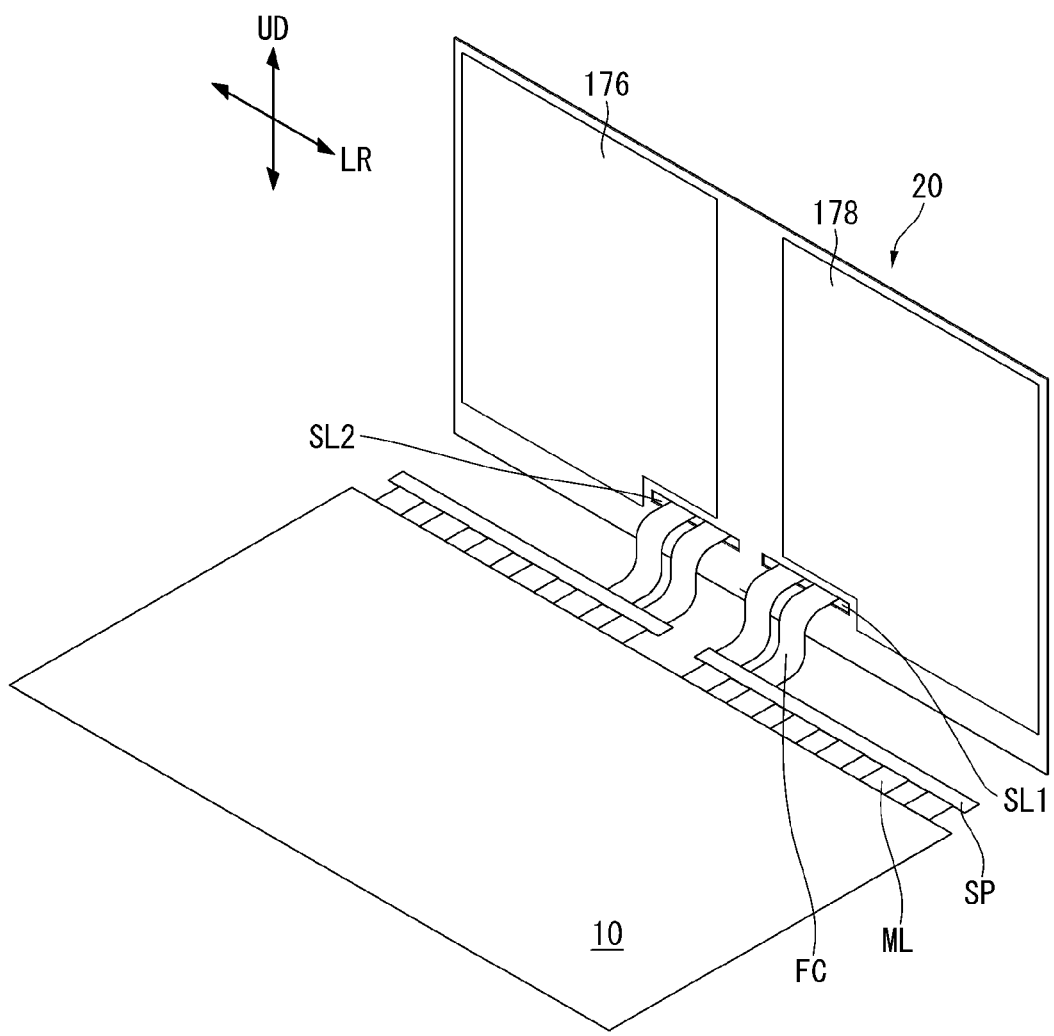
Figure 3:
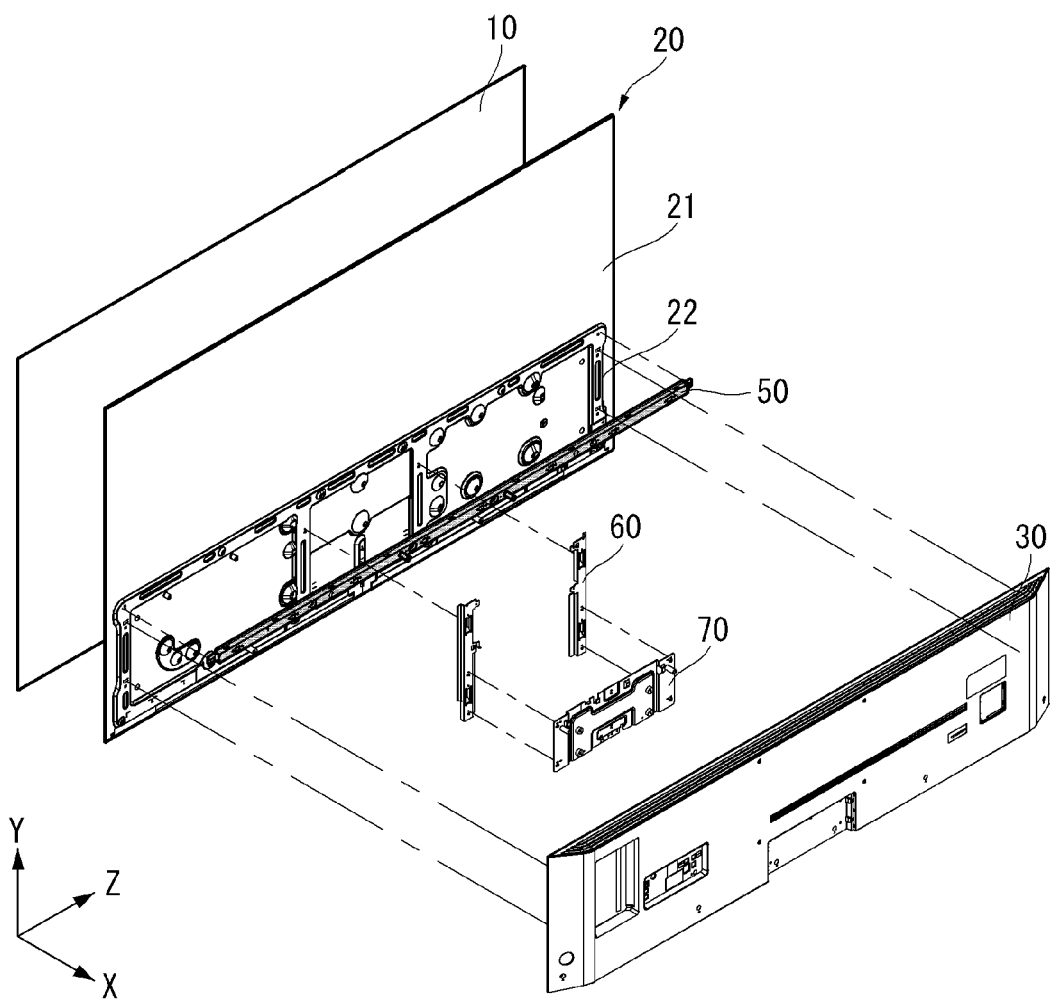
FIGS. 3 to 6 are views showing an example of a module cover according to an embodiment of the present invention.
Figure 4:
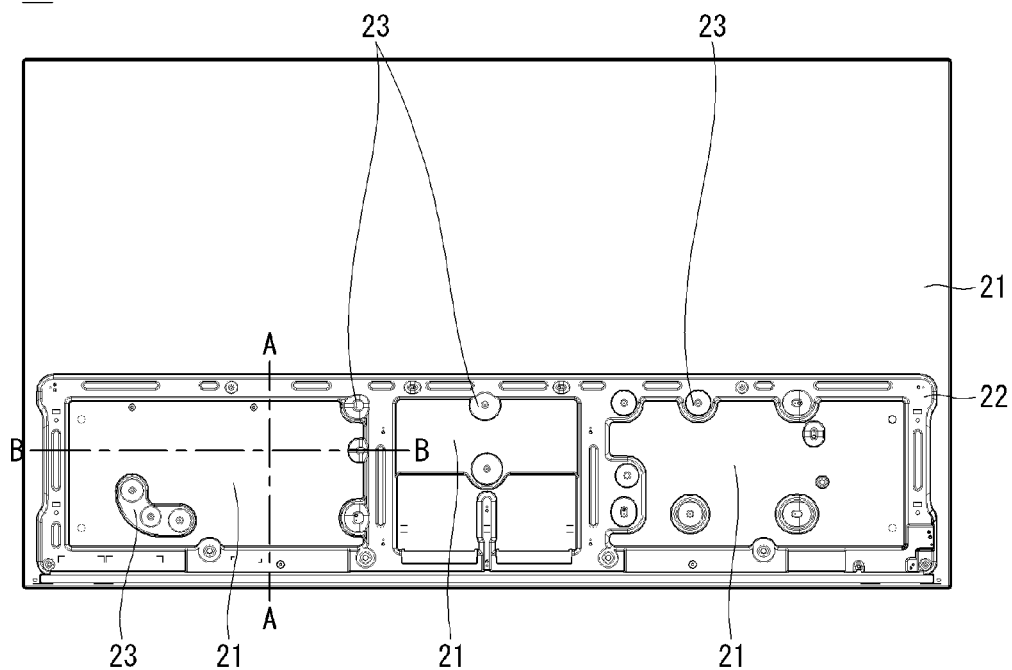

Referring to FIGS. 1 and 2, the display panel 10 may include a transparent substrate, an upper electrode, an organic light emitting layer, and a lower electrode. The transparent substrate, the upper electrode, the organic light emitting layer, and the lower electrode may be sequentially disposed and formed.

The transparent substrate and the upper electrode include a transparent material (e.g., ITO, etc.). The lower electrode may include a non-transparent material, but may also include a transparent material (for example, ITO or the like). In this instance, light can be emitted to one surface of the lower electrode.

When a voltage is applied to the upper and lower electrodes, light emitted from the organic light emitting layer is transmitted through the upper electrode and the transparent substrate to be emitted to the outside. In addition, a light shielding plate may be further formed behind the lower electrode to reflect light emitted to the lower electrode toward the front side.

For example, the display device 100 may be an organic light emitting diode (OLED) display device 100. An active matrix type organic light emitting display panel includes an organic light emitting diode (OLED) which emits light by itself, has a high response speed, and has a large luminous efficiency, luminance, and viewing angle.

The OLED, which is a self-luminous device, includes an anode electrode, a cathode electrode, and organic compound layers (HIL, HTL, EML, ETL, EIL) formed therebetween. The organic compound layer includes a hole injection layer (HIL), a hole transport layer (HTL), an emission layer (EML), an electron transport layer (ETL), and an electron injection layer EIL). When a driving voltage is applied to the anode electrode and the cathode electrode, holes passing through the HTL and electrons passing through the ETL are transferred to the EML to form an exciton. As a result, the light emitting layer (EML) Thereby generating visible light.

Accordingly, the OLED does not require a separate light source, and the volume and weight of the display device 100 can be reduced. In addition, since the reaction speed of the OLED is 1000 times faster than that of the liquid crystal display device, there is less afterimage when the image is displayed.

Referring to FIG. 2, adhesive members 176 and 178 may be located on the front surface of the module cover 20. In particular, the first adhesive member 176 can be disposed on the left side of the module cover 20. Further, the first adhesive member 176 may have magnetism. Alternatively, the first adhesive member 176 may be a double-sided tape.

The second adhesive member 178 can be disposed on the right side of the module cover 20 and may have magnetism. Alternatively, the second adhesive member 178 may be a double-sided tape. In addition, the member layer ML is electrically connected to the display panel 10 and can extend from the display panel 10. The member layer ML may include, for example, a chip-on-film (COF), a chip-on-glass (COG), a flexible printed circuit board (FPCB), a tape carrier package (TCP).

In addition, the source PCB SP is electrically connected to the member layer ML and can integrate a plurality of member layers ML. The cable FC (for example FFC) is electrically connected to the source PCB SP and is electrically connected to control units (unseen) located behind the module cover 20. Further, the cable FC can be inserted into the slots SL1 and SL2 forming on the module cover 20. The slots SL1 and SL2 include a first slot SL1 and a second slot SL2.

As shown, the display panel 10 is positioned in front of the module cover 20 and can be fixed or coupled to the front surface of the module cover 20. In particular, the display panel 10 can be fixed on the front surface of the module cover 20 by the adhesive members 176 and 178.

The display panel 10 is coupled to the front surface of the module cover 20 by magnetic force of the adhesive members 176 and 178. Further, the display panel 10 can be moved left or right or up or down on the module cover 20. That is, the display panel 10 has slight movement while being coupled to the front surface of the module cover 20. In other words, the curvature change of the display panel 10 and/or the module cover 20 may be coped with.

Referring to FIGS. 3 to 6, the module cover 20 is disposed behind the display panel 10, and the back cover 30 is disposed behind the module cover 20. A rigid bar 50, an auxiliary rigid bar 60 and a guide supporter 70 are disposed between the module cover 20 and the back cover 30. The stand 5 (see FIG. 14) can be inserted between the module cover 20 and the back cover 30.

The module cover 20 includes a flat portion 21 and a coupling portion 22. The flat portion 21 forms an overall appearance of the module cover 20, and alternatively may form an overall appearance of the rear surface of the module cover 20. In addition, the coupling portion 22 can be formed by bending a part of the flat portion 21 toward the rear of the module cover 20. Further, the coupling portion 22 may have a shape in which the part of the flat portion 21 protrudes rearward of the module cover 20. For example, the coupling portion 22 can be formed by press-working the flat portion 21.

The coupling portion 22 can also be formed by bending a portion of the flat portion 21 rearwardly, and be provided as a single coupling portion 22 or a plurality of the coupling portions 22. For example, the coupling portion 22 may form one closed curved surface or a plurality of closed curved surfaces separately.

The module cover 20 may include a spacer 23 protruding from the flat portion 21 or the coupling portion 22. In addition, the spacer 23 can be formed by bending a part of the flat portion 21 or a part of the coupling portion 22 toward the rear of the module cover 20. The spacer 23 also has a shape in which the part of the flat portion 21 or the coupling portion 22 protrudes rearward of the cover. For example, the spacer 23 can be formed by press-working the flat portion 21 or the coupling portion 22.

Further, the spacer 23 can be fastened with a component such as a PCB substrate that generates heat. The spacers 23 thus lessen heat transmitted to the display panel 10 by separating the heat source (the heat generating component) from the flat portion 21 of the module cover 20. Therefore, the spacer 23 helps prevent the display panel 10 from being damaged due to heat.

Figure 5:
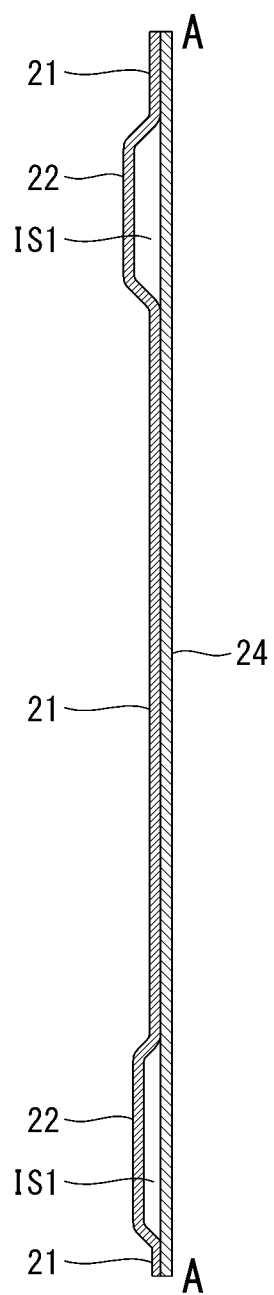
Figure 6:
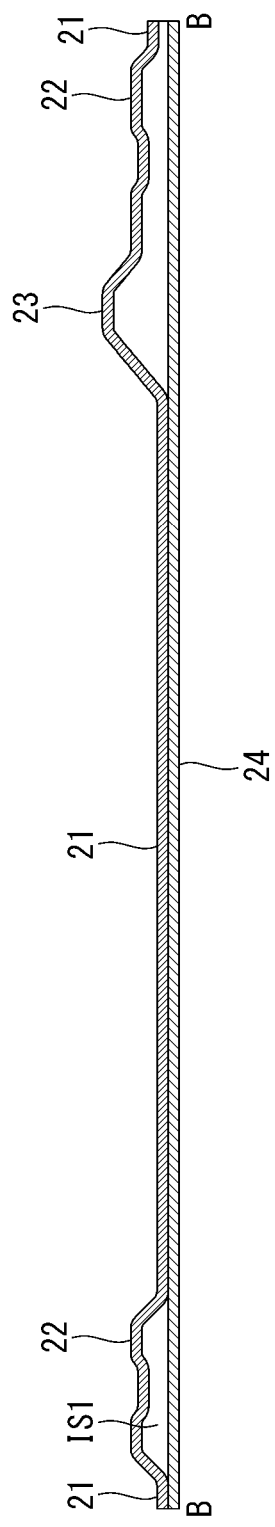
Figure 7:
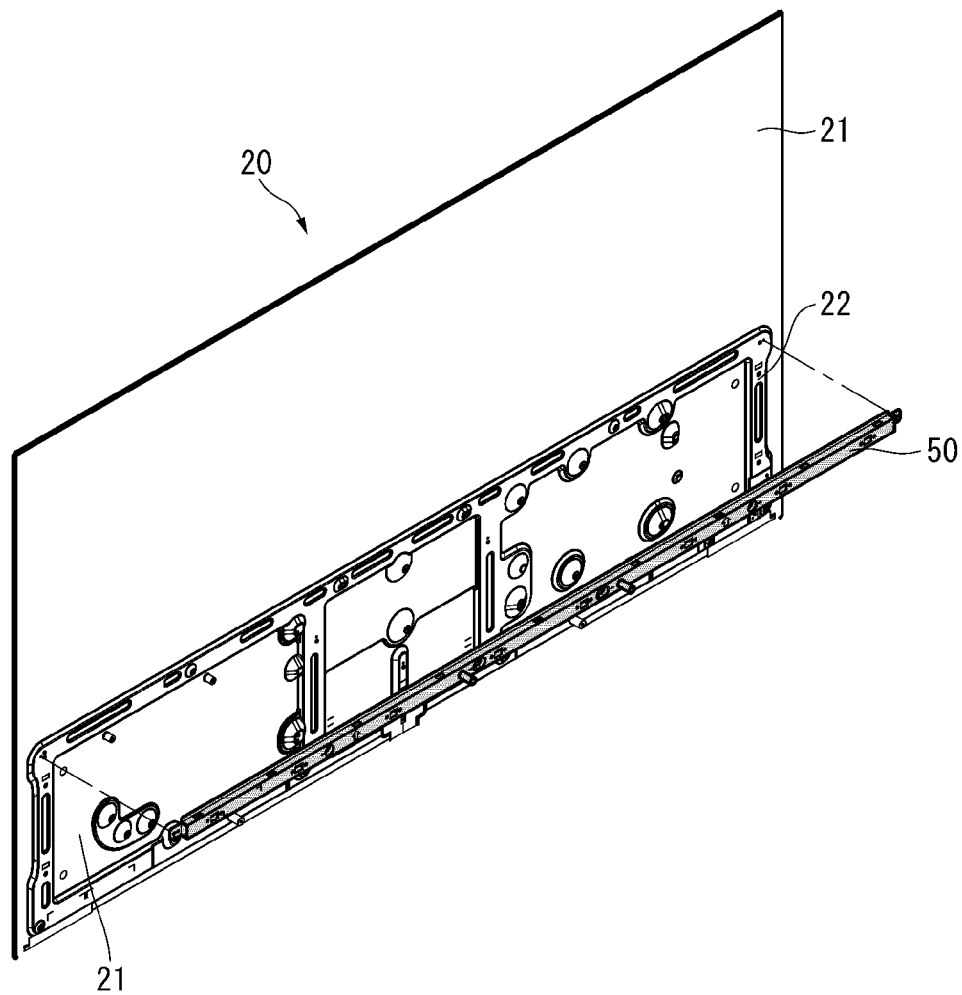
FIGS. 7 to 10 are views showing an example of a rigid bar according to an embodiment of the present invention.

As shown in FIG. 5, the module cover 20 may include a front plate 24 positioned in front of the flat portion 21. Further, the front surface of the front plate 24 may be coupled with the display panel 10, and the rear surface of the front plate 24 may be coupled with the flat portion 21. A bonding member can be disposed between the front plate 24 and the flat portion 21.

Also, the coupling portion 22 includes a first space IS1 which open forward.

The first space IS1 is closed by the front plate 24 or the display panel 10. The coupling portion 22 and the front plate 24 may also form a first space IS1. As shown, the first space IS1 may be formed between the front plate 24 and the coupling portion 22. The coupling portion 22 can also be formed with a second receiving portion 42 (FIG. 16) for fastening the module cover 20 and the back cover 30 to each other. The description of the second receiving portion 42 will be described later.

Referring to FIGS. 7 to 10, the rigid bar 50 can be fastened to the rear surface of the module cover 20. The rigid bar 50 may be elongated in the horizontal direction and be coupled with the coupling portion 22. The horizontal direction is a direction along a horizontal axis.

Figure 8:
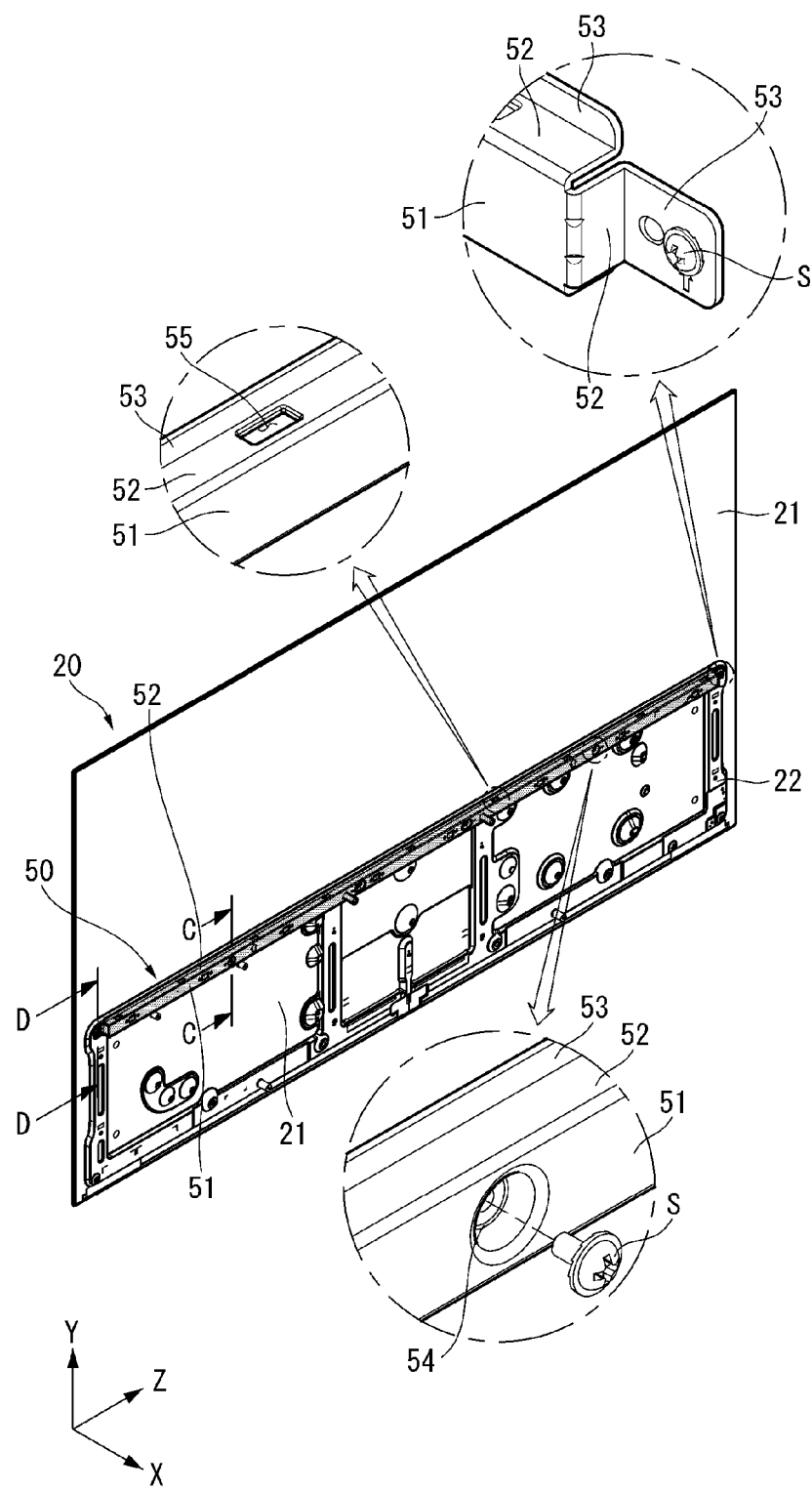
Figure 9:
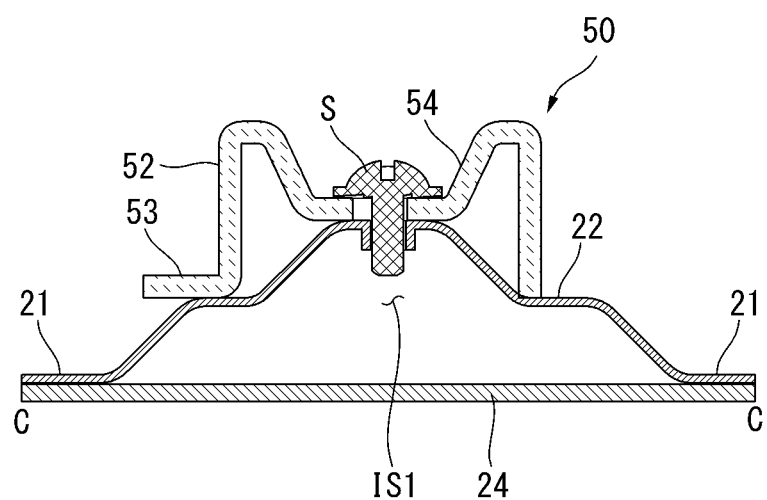
Figure 10:
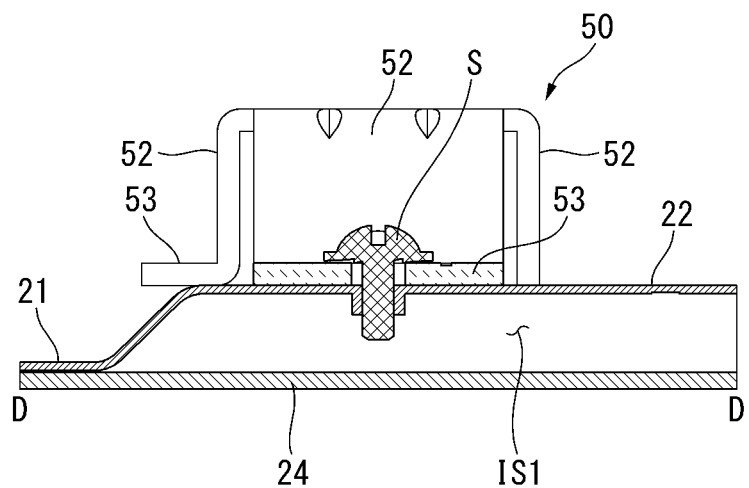
Figure 11:
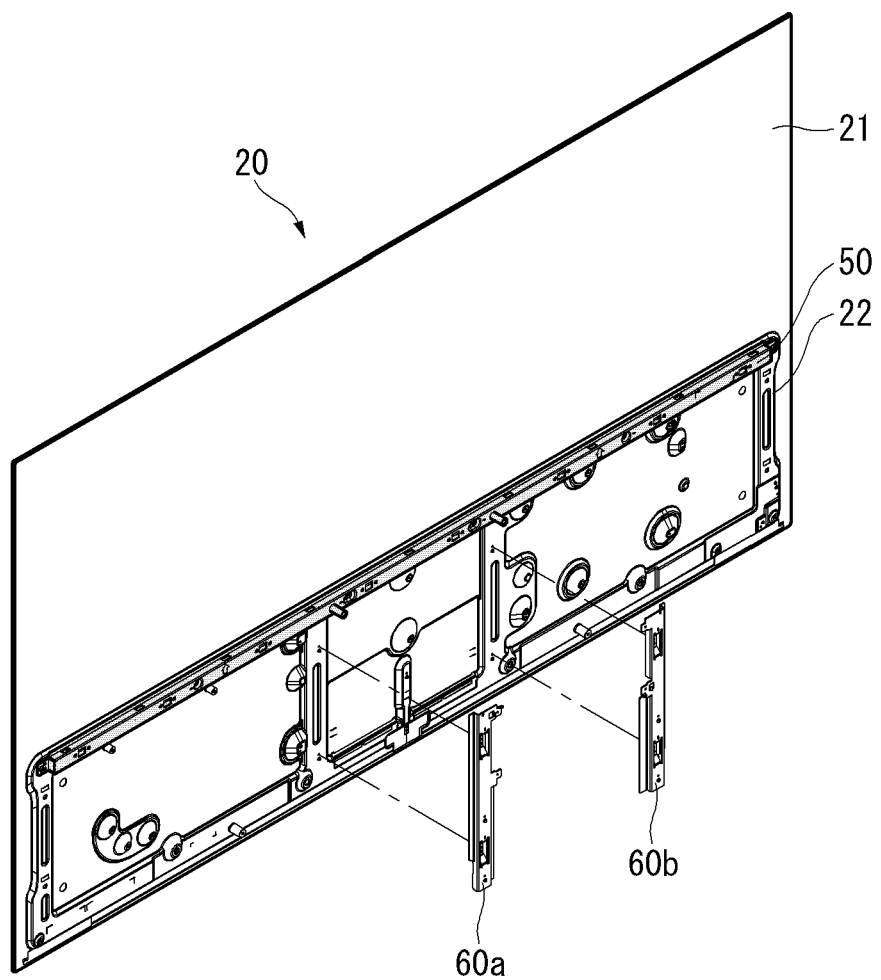
FIGS. 11 to 15 are views showing an example of a component fastened to a module cover according to an embodiment of the present invention.
Figure 12:
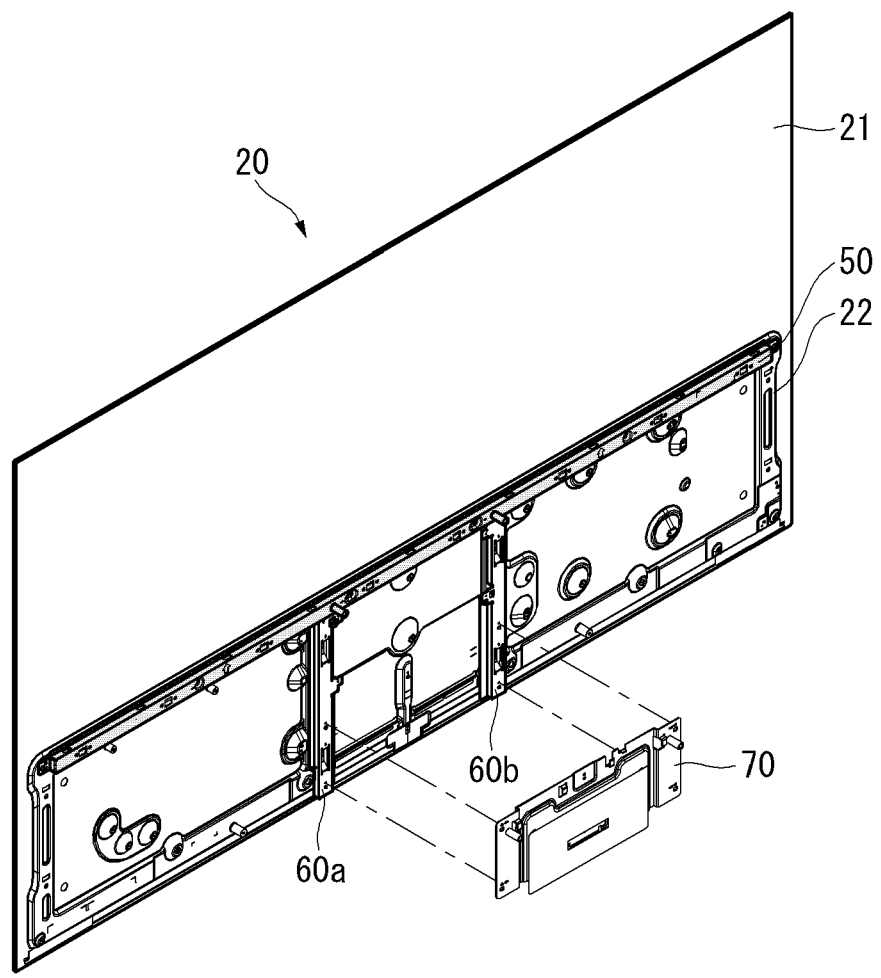
Figure 13:
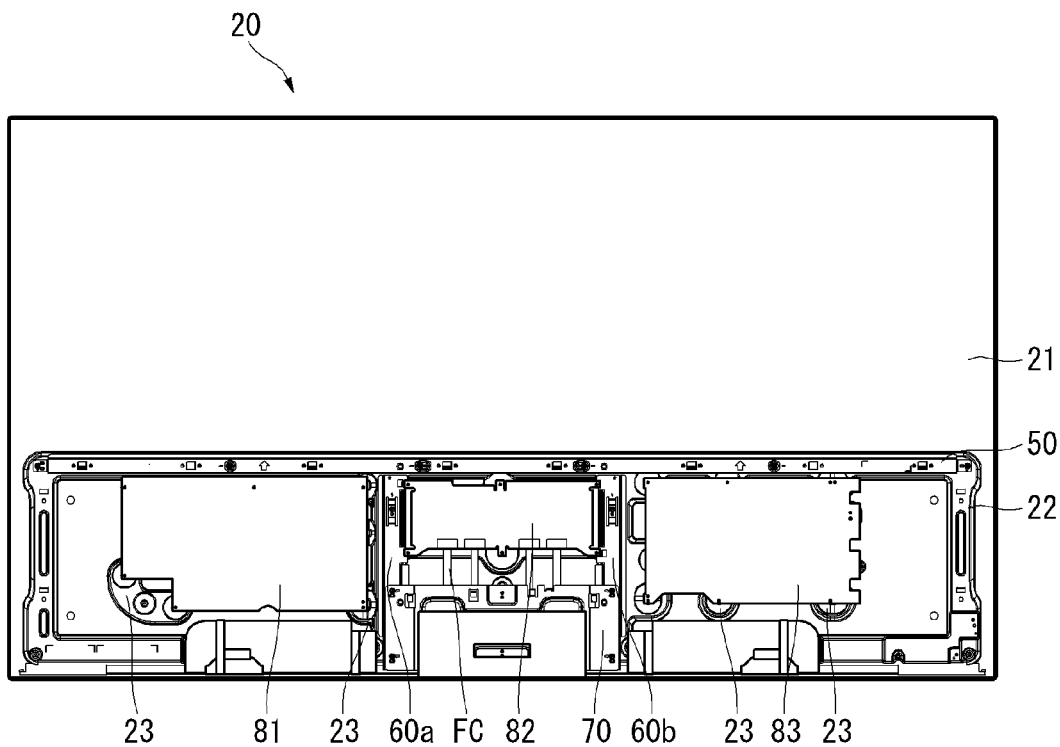

As shown in FIG. 8, the rigid bar 50 also includes a fastening plate 51 facing the coupling portion 22 and a lateral plate 52 bent from the fastening plate 51. The rigid bar 50 also includes a flange 53 formed on the fastening plate 51 or the lateral plate 52.

Further, the fastening plate 51 is disposed parallel to the coupling portion 22 or the flat portion 21. The fastening plate 51 can be positioned spaced apart from the coupling portion 22 and include a recessed portion 54 that is recessed forward. The recessed portion 54 is in contact with the coupling portion 22. A hole may be formed in the recessed portion 54. A hole corresponding to the hole of the recessed portion 54 can also be formed in the coupling portion 22.

In addition, the fastening plate 51 and the coupling portion 22 can be fastened by the fastening member S. For example, the fastening member S can penetrate through the recessed portion 54 and the coupling portion 22. A part of the fastening member S is also positioned in the first space IS1 formed by the coupling portion 22. That is, the coupling portion 22 provides a space in which the fastening member S is inserted or a portion of the fastening member S is accommodated.

As shown, the lateral plate 52 is bent forward from the fastening plate 51 and can be formed by bending an upper portion of the fastening plate 51. In addition, the lateral plate 52 can also be formed by bending a lower portion of the fastening plate 51. Further, the lateral plate 52 can be formed by bending a left portion of the fastening plate 51 and by bending a right portion of the fastening plate 51. The lateral plate 52 is also disposed orthogonal to the fastening plate 51 or the coupling portion 22 or the flat portion 21.

Figure 17:
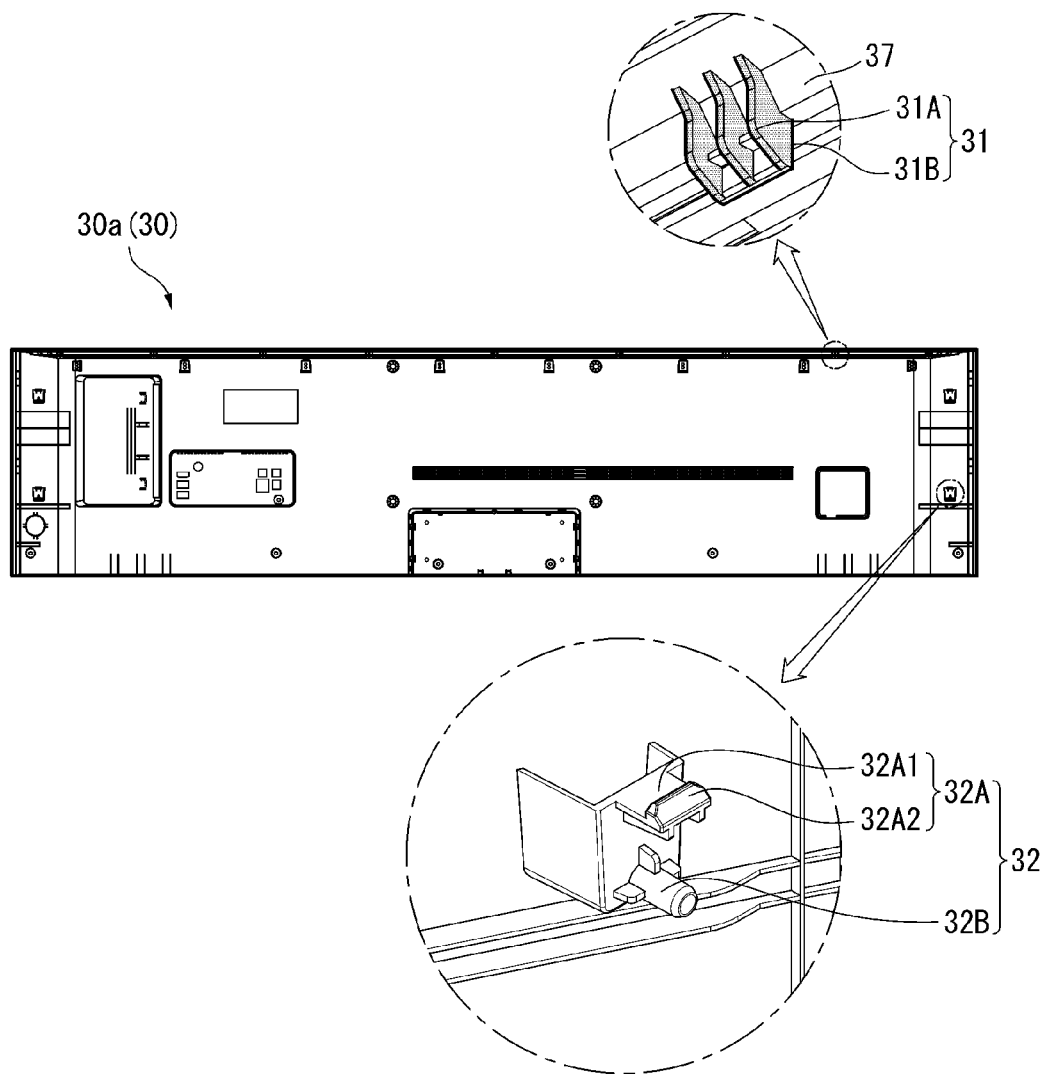
Figure 18:
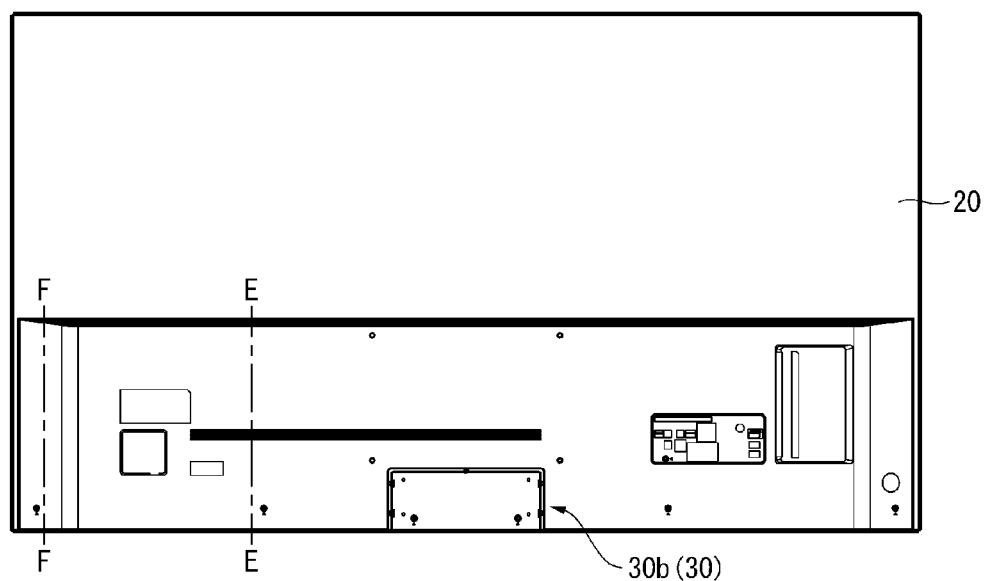
Figure 19:
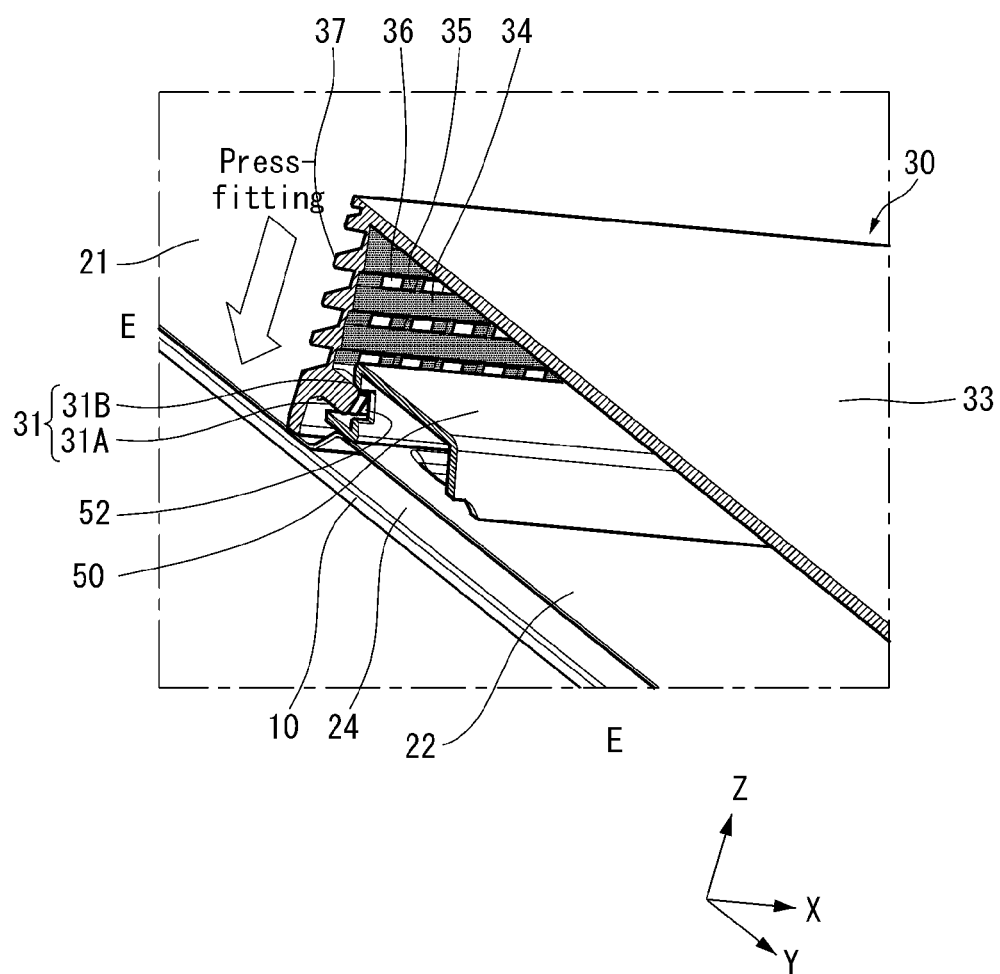
Figure 20:
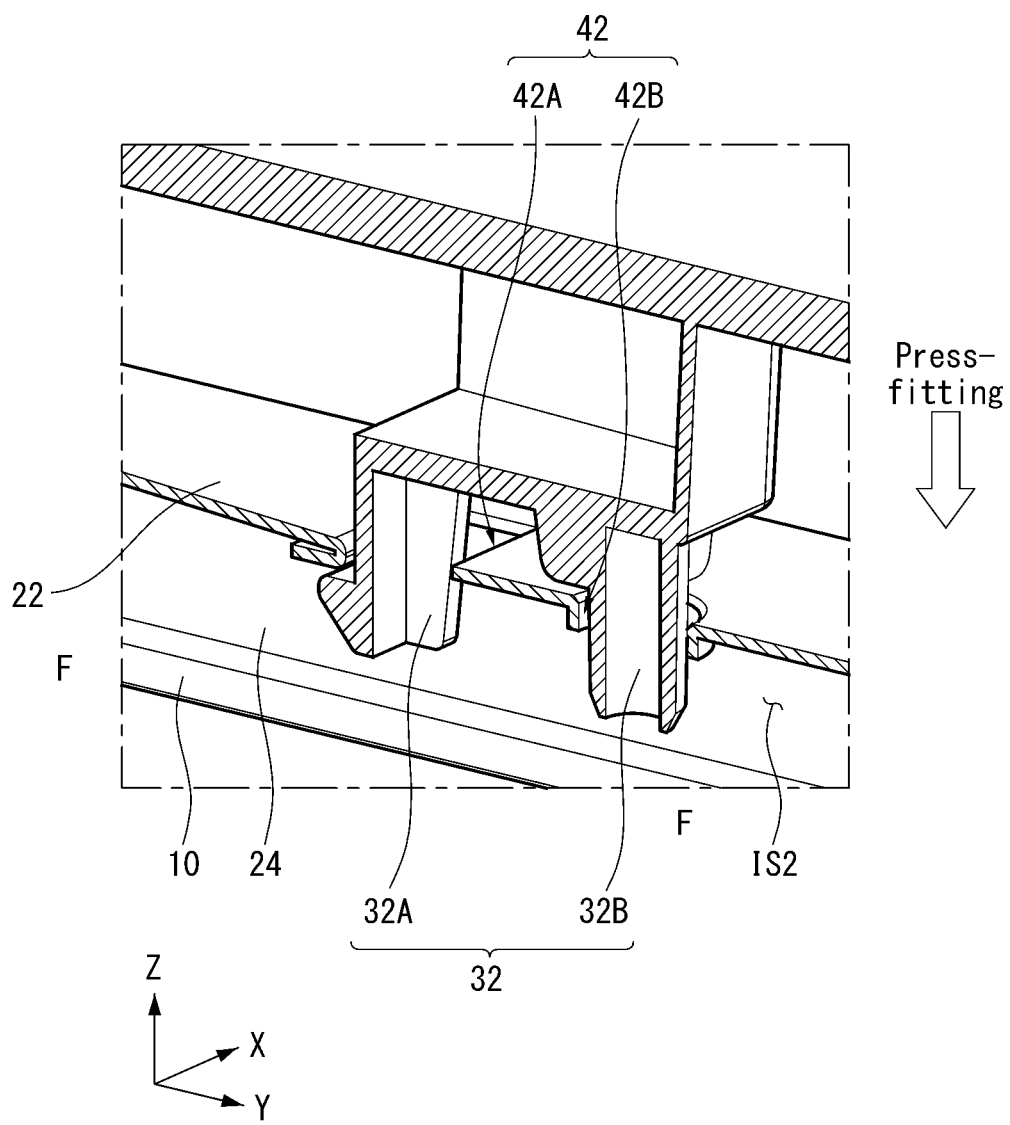

In addition, a first receiving portion 55 is formed on the lateral plate 52. For example, the first receiving portion 55 may be formed on the lateral plate 52 bent at the upper portion of the fastening plate 51. Also, the lateral plate 52 on which the first receiving portion 55 is located can face upward. Thus, the first latch portion 31 (see FIG. 17) of the back cover 30, which will be described later, can be inserted into the first receiving portion 55.

The first receiving portion 55 can also be formed through the lateral plate 52 and have a plurality of first receiving portions 55. For example, the plurality of first receiving portions 55 can be formed along the longitudinal direction of the side plate 52. In addition, the first receiving portion 55 may be a hole in the form of a square or a circle. The first receiving portion 55 may also have a shape of a recess and have a shape of a hole. Thus, the first receiving portion can be referred to as a first receiving opening 55 or a first receiving hole 55.

Further, the flange 53 may be in contact with the coupling portion 22. Alternatively, the flange 53 may be positioned parallel to the fastening plate 51. The flange 53 can support the lateral plate 52 or the fastening plate 51 so that the lateral plate 52 or the fastening plate 51 is stably coupled to the coupling portion 22.

The flange 53 connected to the lateral plate 52 bent at the left side or the right side of the fastening plate 51 can also be fastened to the coupling portion 22. In addition, the flange 53 and the coupling portion 22 can be fastened by the fastening member S. That is, the fastening member S can penetrate the flange 53 and the coupling portion 22. A part of the fastening member S can thus be disposed in the first space IS1 formed by the coupling portion 22. That is, the coupling portion 22 provides a space in which the fastening member S is disposed.

When the size of the display panel 10 is increased, the module cover 20 is also enlarged corresponding to the size of the display panel 10. When the display panel 10 and the module cover 20 are enlarged, there is a concern for the rigidity of the display device 100. By coupling the module cover 20 with the rigid bar 50, the rigidity can be secured. That is, the rigid bar 50 fastened to the module cover 20 in the horizontal direction can secure the overall rigidity of the display device 100 and prevent the display panel 10 or the module cover 20 from being bent.

Referring to FIGS. 11 to 15, an auxiliary rigid bar 60 and a guide supporter 70 may be fastened to the module cover 20. The auxiliary rigid bar 60 may be formed long in the vertical direction. For example, the auxiliary rigid bar 60 can be disposed orthogonal to the rigid bar 50 and be fastened to the coupling portion 22. The auxiliary rigid bar 60 can also be coupled to the lower rear portion of the module cover 20 and be disposed below the rigid bar 50.

Further, the auxiliary rigid bar 60 may have a plurality of auxiliary rigid bars 60. For example, the auxiliary rigid bar 60 may have a first auxiliary rigid bar 60a and a second auxiliary rigid bar 60b. The plurality of auxiliary rigid bars 60a and 60b may be positioned between the rigid bar 50 and a lower side of the coupling portion 22. As shown, the plurality of auxiliary rigid bars 60a and 60b, the rigid bar 50, and the lower side of the coupling portion 22 have a shape of a ladder.

In addition, the first auxiliary rigid bar 60a and the second auxiliary rigid bar 60b can be spaced apart and disposed in the horizontal direction. When the stand 5 (FIG. 14) is inserted or fitted between the module cover 20 and the back cover 30, the weight load of the display device 100 can be concentrated in a specific area. Further, the auxiliary rigid bar 60 can secure rigidity or stiffness such that the display device 100 is not deformed even if the weight load is concentrated on a specific area of the display device 100.

The guide supporter 70 can also be disposed behind the module cover 20. Further, a side of the guide supporter 70 can be fastened to the first auxiliary rigid bar 60a and another side of the guide supporter 70 can be fastened to the second auxiliary rigid bar 60b. The other side of the guide supporter 70 is opposite the side of the guide supporter 70. In addition, the guide supporter 70 provides a space in which the stand 5 is to be inserted or accommodated. That is, the space is formed between the guide supporter 70 and the back cover 30, and the stand 5 is inserted into the space.

Further, the rigid bar 50 extends in the horizontal direction, and the auxiliary rigid bar 60 extends in the vertical direction. The auxiliary rigid bar 60 reinforces the flexural and/or torsional stiffness of the display device 100. In addition, the guide supporter 70 is mounted on the auxiliary rigid bar 60 so as to overlap with the auxiliary rigid bar 60. The guide supporter 70 is also provided with additional stiffness from the auxiliary rigid bar 60.

Figure 14:
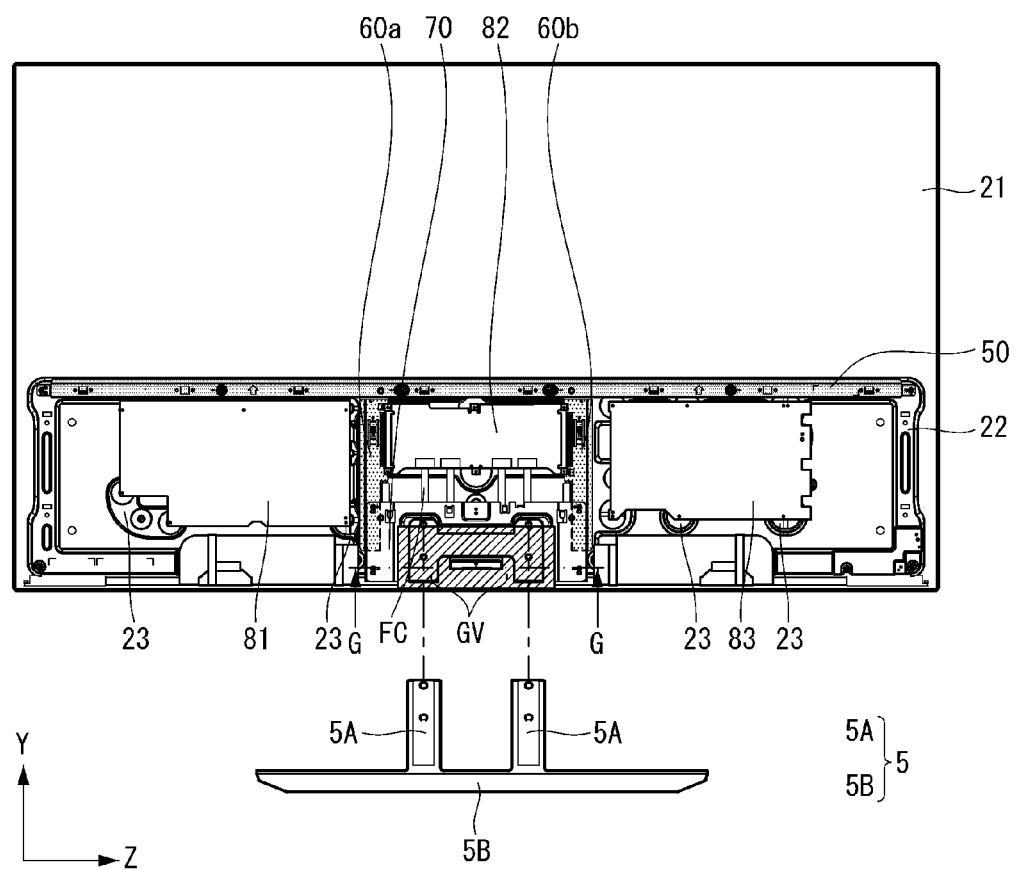
Figure 15:
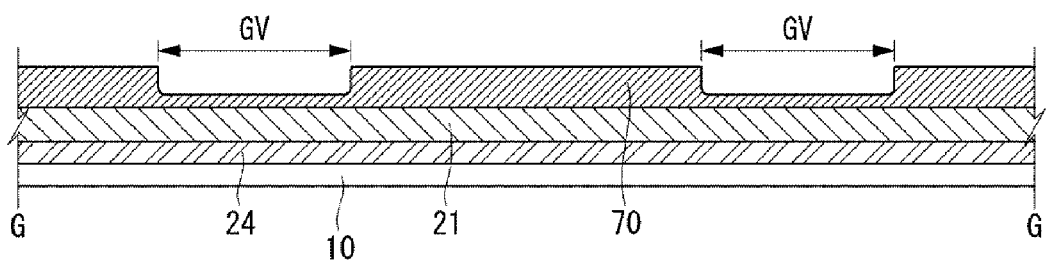

As shown in FIG. 14, the stand 50 may include a fastening leg 5A and a pedestal 5B. In particular, the fastening leg 5A is elongated from the pedestal and inserted or fitted between the module cover 20 and the back cover 30. The rigid bar 50 and the pedestal 5B are also parallel to each other, and the fastening leg 5A is positioned between the rigid bar 50 and the pedestal 5B. The fastening leg 5A is also parallel to the auxiliary bar 60.

In addition, the rigid bar 50, the pedestal 5B, and the fastening leg 5A, have a shape of the ladder. The rigid bar 50, the pedestal 5B, and the auxiliary bar 60, may also have a shape of the ladder. Further, the guide supporter 70 includes a fastening groove GV for fastening the stand 5. The fastening groove GV may have a plurality of fastening grooves GV.

The fastening legs 5A of the stand 5 are inserted into the fastening grooves GV of the guide supporter 70 and then fastened by a screw or the like. Since the guide supporter 70 is provided with additional rigidity from the auxiliary rigid bar 60, the fastening rigidity of the stand 5 of the display device 100 is increased and the support force of the stand 5 is stably secured.

In addition, an electronic component can be coupled to the rear surface of the module cover 20. The electronic component includes, for example, a power supply unit 81, a timing control board 82, or a driver 83. The electronic component can be fastened to the spacer 23. Further, the heat of the electronic component may have a negative effect on the display panel 10. However, the electronic component can be separated from the flat portion 21 of the module cover 20, because the electronic component is fastened to the spacer 23. Thus, the display panel 10 can be prevented from being damaged by the heat generated from the electronic component.

Referring to FIGS. 16 to 20, the back cover 30 can be coupled with the rigid bar 50 and the module cover 20. When the back cover 30 is coupled with the rigid bar 50 and the module cover 20, the flat portion 21 and the back cover 30 form the back surface of the display device 100. The coupling portion 22, the rigid bar 50, the auxiliary rigid bar 60, the power supply unit 81, the timing control board 82 or the driver 83 are positioned between the module cover 20 and the back cover 30.

The back cover 30 may include a cover plate 33 and lateral walls extending forward from the cover plate 33. The cover plate 33 may be disposed to be spaced apart from the module cover 20 and face the coupling portion 22.

The back cover 30 may include a first lateral wall 37 extending from the top of the cover plate 33 toward the module cover 20. A first latch 31 for fastening the back cover 30 and the rigid bar 50 may be formed on the first side wall 37. The first latch 31 protrudes from the inner surface of the first lateral wall 37. The first latch 31 may include a plurality of first latches 31 formed along the longitudinal direction of the first lateral wall 37.

Further, the back cover 30 may include an inner surface 30a and an outer surface 30b. The inner surface 30a of the back cover 30 faces the module cover 20, and the outer surface 30b of the back cover 30 faces rearward of the display device 100. The inner surface 30a of the back cover 30 also covers at least a part of the module cover 20, and the outer surface 30b includes an outer surface of the cover plate 33 and an outer surface of the lateral walls 37 and 38. The inner surface 30a may include an inner surface of the cover plate 33 and an inner surface of the lateral walls 37 and 38. The first latch 31 may also protrude from the inner surface 30a of the back cover 30.

When the back cover 30 is coupled with the module cover 20, the rear surface of the module cover 20 and the inner surface 30a of the back cover 30 form a space. As discussed above, the space formed by the back cover 30 and the module cover 20 accommodates the rigid bar 50, the auxiliary rigid bar 60, the guide supporter 70, the power supply unit 81, the timing control board 82, and the driver 83.

In addition, the first latch 31 includes a guide surface 31A for guiding the press-fitting of the first latch 31 and a constraint surface 31B for fixing the first latch 31 in the first receiving portion 55. The guide surface 31A may have a certain curvature or a certain angle so that the first latch 31 of the back cover 30 can easily guide the first latch 31 into the first receiving portion 55. Further, the constraint surface 31B allows the first latch 31 to be press-fitted and restrained to the lateral plate 52 where the first receiving portion 55 is located. The constraint surface 31B is also in close contact with the first receiving opening 55 of the lateral plate 52 of the rigid bar 50. Thus, the first latch 31 can be firmly fixed in the first receiving portion 55. Also, the angle formed by the constraint surface 31B and the guide surface 31A may be an acute angle.

In addition, the rigid bar 50 may include a plurality of first receiving portions 55 corresponding to the plurality of first latches 31 of the back cover 30. When the rigid bar 50 and the back cover 30 are fastened together, the first latch 31 passes through or is fitted in the lateral plate 52.

The back cover 30 also includes a second lateral wall 38 protruding toward the module cover 20 from the left or right side of the cover plate 33. A second latch 32 for fastening the back cover 30 and the module cover 20 may also be formed on the second lateral wall 38. The second latch 32 protrudes from the inner surface of the second lateral wall 38 and may include a plurality of second latches 32. The plurality of second latches 32 are positioned along the longitudinal direction of the second lateral wall 38. In more detail, the longitudinal direction of the second lateral wall 38 is the vertical direction, and the lengthwise direction of the second lateral wall 38 is parallel to the lengthwise direction of the auxiliary rigid bar 60.

Further, the second latch 32 may include a fastening latch 32A and a guide latch 32B. The fastening latch 32A and the guide latch 32B can be disposed spaced apart from each other. The guide latch 32B may be located below the fastening latch 32A. For example, the guide latch 32B may be positioned adjacent to the lower side of the fastening latch 32A. The guide latch 32B guides the fastening latch 32A to the second receiving portion 42, and the fastening latch 32A can be fastened or fixed to the second receiving portion 42 of the module cover 20.

The fastening latch 32A may include a first part 32A1 and a second part 32A2. In more detail, the first part 32A1 is extended from the inner surface 30a of the back cover 30 and protrudes towards the module cover 20. The second part 32A2 is bent and extended from the first part 32A1 and protrudes upwards. The second part 32A2 may also protrude towards the first lateral wall 37. A protruding direction of the second part 32A2 may be opposite to a protruding direction of the first latch 31.

In addition, the coupling portion 22 may include a plurality of second receiving portions 42 corresponding to the plurality of second latches 32 of the back cover 30. When the back cover 30 is coupled with the module cover 20, the second latch 32 penetrates through the coupling portion 22.

The second receiving portion 42 may include a receiving hole 42A and a guide hole 42B. Thus, the fastening latch 32A of the second latch 32 can be inserted or fixed or accommodated in the receiving hole 42A. The fastening latch 32A can also be coupled with the receiving hole 42A via hooking. For example, the second part 32A2 of the fastening latch 32A can be hooked with the receiving hole 42A, and the guide latch 32B of the second latch 32 can be inserted into the guide hole 42B.

Figure 16:
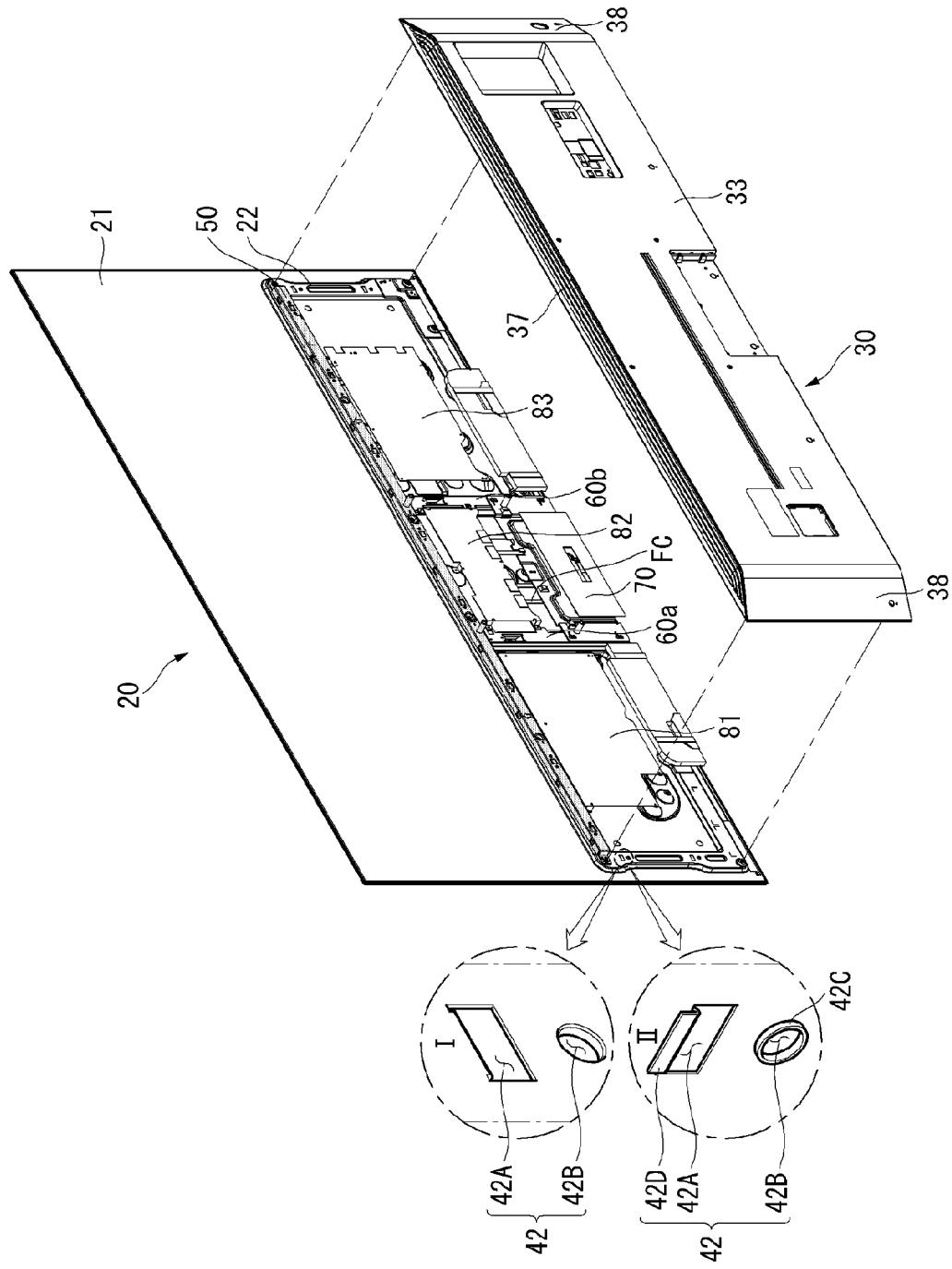
FIGS. 16 to 20 are views showing an example of fastening the back cover according to an embodiment of the present invention.

Further, "I" of FIG. 16 shows a partially enlarged view of the second receiving portion 42 viewed at the rear of the module cover 20, and "II" of FIG. 16 shows a partially enlarged view of the second receiving portion 42 viewed at the front of the module cover 20. The second receiving portion 42 may further include a hemming portion 42D positioned on a front side of the coupling portion 22. In particular, the hemming portion 42D improves the workability of the assembling or disassembling process of the second latch 32. Further, the hemming portion 42D can be formed by bending a part of the coupling portion 22 toward the display panel 10 and upward.

In addition, the receiving hole 42A may be formed by bending the part of the coupling portion 22. The hemming portion 42D protrudes upward and may protrude towards the first lateral wall 37. The hemming portion 42D may be located on an circumference of the receiving hole 42A. For example, the hemming portion 42D can be positioned above the receiving hole 42A. Further, the hemming portion 42D is in correspondence to the second part 32A of the fastening latch 32A, and thus the second part 32A of the fastening latch 32A can be coupled with the hemming portion 42D. The hemming portion 42D therefore serves as a latching jaw so that the fastening latch 32A can be fastened to the receiving hole 42A.

In addition, the second receiving portion 42 may further include a rib portion 42C formed to protrude forward from the periphery of the guide hole 42B. The rib portion 42C protrudes towards the display panel 10 and has a shape of a cylinder with a hollow portion. The rib portion 42C can thus accommodate the second latch 32. For example, the rib portion 42C can accommodate the guide latch 32B.

Further, the second part 32A2 of the fastening latch 32A may be referred to as a head 32A2 of the fastening latch 32A. In more detail, the head 32A2 of the fixed latch 32A is a fixed projection with a hook shape having an arrow-shaped cross section in one direction or in both directions. The head 32A2 can be press-fitted and fixed in the receiving hole 42A, and the guide latch 32B can be press-fitted into the guide hole 42B, and guide the position of the receiving hole 42A into which the fastening latch 32A is to be press-fitted.

In addition, the head 32A2 of the fastening latch 32A or a portion of the guide latch 32B can be disposed to penetrate the coupling portion 22. The head 32A2 of the fastening latch 32A or the portion of the guide latch 32B can thus be disposed in a second space IS2 formed by the coupling portion 22.

Further, the first latch 31 of the back cover 30 can be coupled with the first receiving portion 55 of the rigid bar 50, and the second latch 32 of the back cover 30 can be coupled with the second receiving portion 42 of the module cover 20. The back cover 30 thus can stably be fastened to the rigid bar 50 and the module cover 20. Also, the electronic component disposed on the rear surface of the module cover 20 can be protected safely. This is advantageous because a separate fastening member for fastening the back cover 30 and the rigid bar 50 is not necessary. Further, a separate fastening member for fastening the back cover 30 and the module cover 20 is not required.

In addition, the back cover 30 may include a plurality of heat dissipation openings 36 formed in the first lateral wall 37. In more detail, the heat dissipation openings 36 can be formed through the first lateral wall 37. Thus, heat generated from the electronic components disposed between the back cover 30 and the module cover 20, escapes outside through the heat dissipation opening 36.

Further, the first lateral wall 37 may include a matrix including a first structure 34 arranged in a first direction at regular intervals and a second structure 35 arranged in a second direction at certain intervals. The first structures 34 cross the second structures 35, and the heat dissipation openings 36 are surrounded by the first structure 34 and the second structure 35.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
   a display panel;
   a module cover at a rear of the display panel;
   a rigid bar coupled with a coupling portion on a rear surface of the module cover, the rigid bar elongated along a side of the display panel; and
   a back cover at a rear of the module cover and covering the rigid bar,
   wherein the rigid bar includes:
     a fastening plate spaced apart from the coupling portion of the module cover;
     a lateral plate bent toward the module cover from the fastening plate; and
     at least one first receiving portion formed on the lateral plate, and
   wherein the back cover includes:
     an outer surface facing a rear of the back cover;
     an inner surface facing the module cover; and
     at least one first latch protruding from the inner surface and configured to be accommodated in the first receiving portion of the rigid bar.

2. The display device of claim 1, wherein the back cover further includes:
   a cover plate spaced apart from the module cover; and
   a first lateral wall elongated toward a front of the back cover from an upper side of the cover plate,
   wherein the first latch protrudes from an inner surface of the first lateral wall, and
   wherein the inner surface of the first lateral wall faces the module cover.

3. The display device of claim 1, wherein the module cover includes:
   a flat portion forming the rear surface of the module cover; and
   the coupling portion bent toward the rear of the module cover from the flat portion.

4. The display device of claim 3, wherein the first receiving portion includes a plurality of first receiving portions disposed in a lengthwise direction of the lateral plate, and
   wherein the first latch includes a plurality of first latches disposed in a lengthwise direction of the first lateral wall such that the plurality of first latches are accommodated in the plurality of first receiving portions, respectively.

5. The display device of claim 4, wherein the rigid bar further includes a flange elongated from the lateral plate,
   wherein the flange is coupled with the coupling portion of the module cover, and
   wherein the coupling portion forms a first space accommodating a fastening member penetrating the flange and the coupling portion and fastening the rigid bar to the coupling portion.

6. The display device of claim 4, wherein the rigid bar further includes a recessed portion depressed towards the module cover from the fastening plate, and
   wherein a fastening member penetrates the recessed portion and the module cover to fasten the rigid bar to the coupling portion of the module cover.

7. The display device of claim 2, wherein the back cover further includes:

a second lateral wall elongated toward a left side or a right side of the cover plate; and a second latch protruding from an inner surface of the second lateral wall, the inner surface of the second lateral wall facing the module cover, wherein the second latch includes a plurality of second latches, and wherein the module cover includes a plurality of second receiving portion passing through the coupling portion such that the plurality of second latches are inserted in the plurality of second receiving portions.

8. The display device of claim 7, wherein each of the second receiving portions include:

a receiving hole penetrating through the coupling portion; and a guide hole penetrating through the coupling portion, the guide hole positioned adjacent to the receiving hole, and wherein each of the second latches includes:

a hook-shaped fastening latch inserted into the receiving hole; and a pillar-shaped guide latch inserted into the guide hole.

9. The display device of claim 8, wherein the pillar-shaped guide latch is fitted in the guide hole and the hook-shaped fastening latch is hooked with the receiving hole.

10. The display device of claim 2, wherein the first lateral wall includes a plurality of heat dissipation openings penetrating through the first lateral wall.

11. The display device of claim 3, wherein the module cover further includes a spacer protruding toward a rear of the flat portion, wherein the spacer is coupled with a power supply unit, and wherein the power supply unit is positioned between the module cover and the back cover.

12. The display device of claim 3, further comprising:

a first auxiliary rigid bar fastened to the coupling portion, wherein the first auxiliary rigid bar is perpendicular to the rigid bar, and wherein the first auxiliary rigid bar is positioned between the module cover and the back cover.

13. The display device of claim 12, further comprising:

a second auxiliary rigid bar positioned apart from the first auxiliary rigid bar;

a guide supporter having a first side fastened to the second auxiliary rigid bar and a second side fastened to the first auxiliary rigid bar; and a stand inserted into the guide supporter.

14. The display device of claim 3, further comprising:

a front plate positioned behind the display panel and being coupled with the flat portion, wherein a space is formed between the front plate and the coupling portion.

15. The display device of claim 1, wherein the coupling portion of the module cover comprises a ladder shape including a lower side rail positioned on a lower surface of the module cover and an upper side rail spaced apart and positioned above the lower side rail.

16. The display device of claim 15, wherein the rigid bar is mounted to the upper side rail of the ladder-shaped coupling portion of the module cover.

17. The display device of claim 16, further comprising:

a first auxiliary rigid bar fastened to a first rung of the ladder-shaped coupling portion, wherein the first auxiliary rigid bar is perpendicular to the rigid bar;

a second auxiliary rigid bar positioned apart from the first auxiliary rigid bar and fastened to a second rung of the ladder-shaped coupling portion;

a guide supporter having a first side fastened to the second auxiliary rigid bar and a second side fastened to the first auxiliary rigid bar; and a stand inserted into the guide supporter.

18. The display device of claim 1, wherein the back cover covers a lower partial portion of the module cover and the rigid bar.

19. The display device of claim 1, wherein a power supply unit, timing controller and driving circuit are mounted to the coupling portion of the module cover and are covered by the back cover.

20. The display device of claim 1, wherein the rigid bar is fastened to the module cover in a horizontal direction to secure an overall rigidity of the display device.

* * * * *